United States Patent [19]

Fedde

[11] Patent Number: 4,484,357
[45] Date of Patent: Nov. 20, 1984

[54] SPONTANEOUS CHANNEL CONTINUITY SCANNING RADIO

[75] Inventor: Chris S. Fedde, Palatine, Ill.
[73] Assignee: Motorola, Inc., Schaumburg, Ill.
[21] Appl. No.: 356,876
[22] Filed: Mar. 10, 1982
[51] Int. Cl.³ .............................................. H03J 7/18
[52] U.S. Cl. .................................... 455/166; 455/186; 455/77
[58] Field of Search ................... 455/161, 166, 76, 77, 455/185, 186

[56] References Cited
U.S. PATENT DOCUMENTS

| | | | |
|---|---|---|---|
| 3,497,813 | 2/1970 | Gallagher | 455/166 |
| 3,614,621 | 10/1971 | Chapman | 455/166 |
| 3,617,895 | 11/1971 | Tomsa | 455/166 |
| 4,100,497 | 7/1978 | Fathaver et al. | 455/166 |
| 4,123,717 | 10/1978 | Yiu et al. | 455/166 |
| 4,127,821 | 11/1978 | Okada et al. | 455/185 |

Primary Examiner—Jin F. Ng
Attorney, Agent, or Firm—F. John Motsinger; Edward M. Roney; James W. Gillman

[57] ABSTRACT

An improved channel scanning radio which automatically monitors a channel being monitored by the scanning circuitry at the time of the microphone is taken off-hook by treating that channel as a priority channel for a short period after the microphone is returned to the hang-up position. This permits the operator to automatically monitor a channel of interest without stopping the scan function.

7 Claims, 4 Drawing Figures

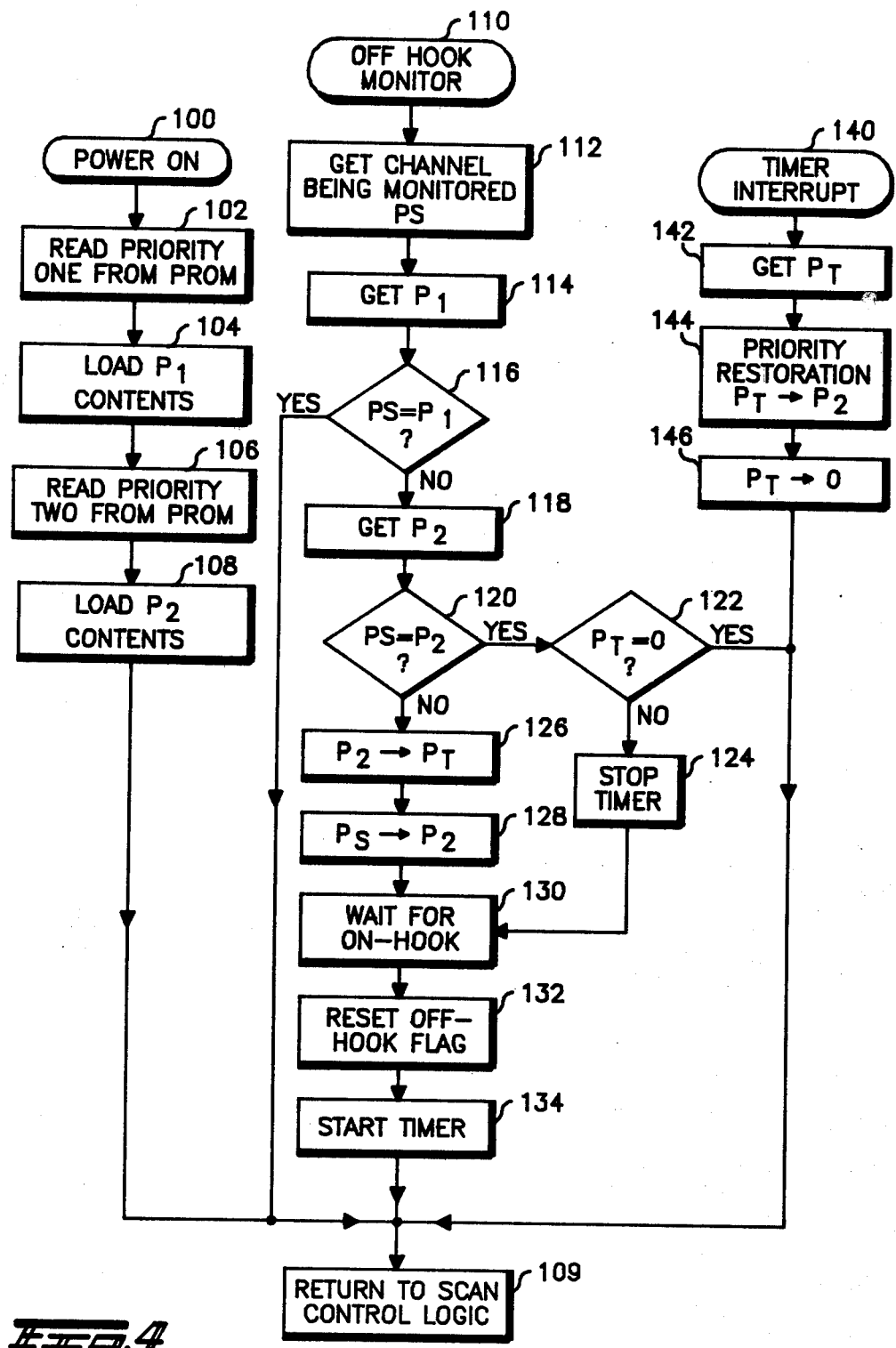

SPONTANEOUS CHANNEL CONTINUITY SCANNING RADIO

BACKGROUND OF THE INVENTION

1. Field of the Invention

This invention relates generally to scanning radio receivers and in particular to an improved channel scanning radio receiver which automatically monitors an activated channel with priority without stopping the scan function.

2. Description of the Prior Art

Scanning radio receivers which automatically and sequentially scan a plurality of channels for tuning to predetermined radio frequencies, lock on to a tuned channel receiving a signal, and upon termination of the received signal automatically resume the scan to locate another channel receiving a signal are now well known. In addition, some systems utilize a priority scanning operation in which a priority is assigned to one of the channels and in some systems a secondary priority is assigned to yet another channel. In a system having such a priority channel it is necessary to continuously sample the priority channels during the reception of signals on other channels and to lock onto the priority channel whenever a carrier is detected during a sampling interval. Such a system is disclosed in U.S. Pat. No. 3,614,621 issued on Oct. 19, 1971 to Ron Chapman, et al. and assigned to Motorola, Inc.

Such channel scanning radios have several major limitations which make them cumbersome and unsuitable for two way communications. One attempt to make two way communications possible on a channel, for example, to answer an incoming call detected by the channel scanner, requires freezing the scanner on the channel when the microphone is removed from its holder. However, the microphone must be manually left off hook for a period of time to ensure any further communications will be received. Thus, either the scanning must be stopped with possible loss of desired information on another channel, or the user risks loss of any unanticipated further communications on the channel. Another approach uses a delay in resumption of scanner function following termination of a signal on a receiving channel. This however results in dramtically slowing down the scanning with resultant loss of communications. Consequently, the prior art does not permit the user to conveniently follow the progress of communications on a desired channel during periods of frequent channel activity without losing the advantages of the scanning function.

SUMMARY OF THE INVENTION

It is an object of the invention, therefore, to provide an improved channel scanning radio which automatically follows the progress of communications on a desired channel without stopping the scanning function.

It is another object of the invention to provide a scanning radio which notes the channel being monitored at the time of activating a monitoring function and treating that channel as a channel to be monitored with priority for a predetermined time period.

It is yet another object of the invention to provide a method of channel scanning which is particularly suitable for two way radio communications systems with high channel activity.

Briefly, according to the invention, there is provided a scanning radio receiver for receiving signals on a predetermined number of channels at least one of which is designated as a priority channel. The receiver has scanning circuitry for sequentially selecting individual ones of the predetermined channels including a priority channel monitoring circuit. A switch means is provided for generating a control signal in response to activation of the switch and a priority memory is coupled to the scanning circuitry for storing the designated priority channels. A priority modification circuit is coupled to the switch means for modifying the priority memory in response to the control signal such that the channel selected by the scanning circuitry at the moment the control signal is generated is temporarily scanned as a priority channel.

BRIEF DESCRIPTION OF THE DRAWINGS

The features of the present invention which are believed to be novel are set forth in particularity in the appended claims. The invention, together with further objects and advantages thereof, may best be understood by reference to the following description when taken in conjunction with the accompanying drawings.

FIG. 4 is a detail program flow diagram of the computer program for the invention.

DETAILED DESCRIPTION OF THE PREFERRED EMBODIMENT

Figure 1:
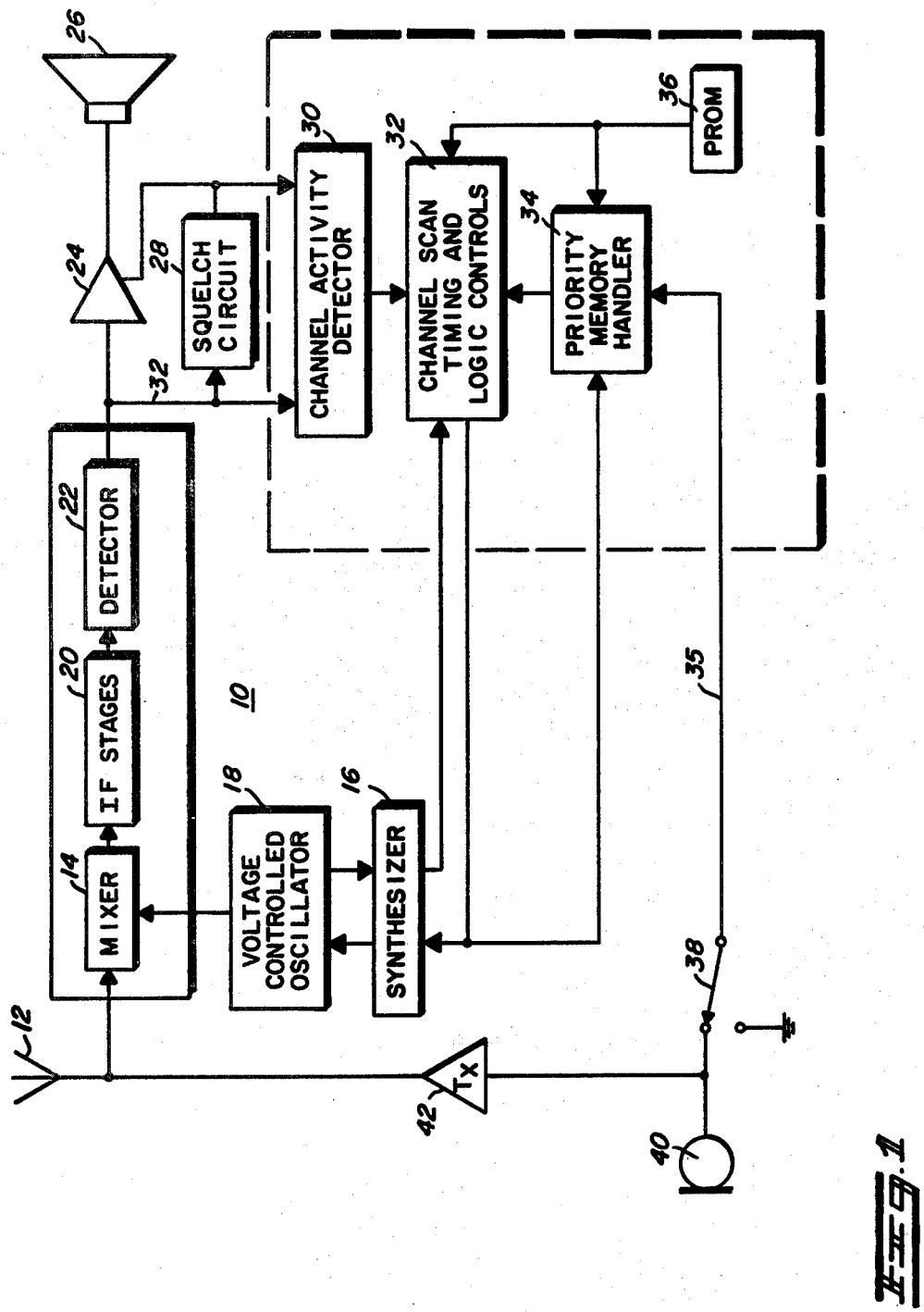
FIG. 1 is a block diagram illustrating one embodiment of the inventive scanning radio according to the invention.

Referring now to the drawings, there is illustrated in FIG. 1 a block diagram of an improved signal seeking radio 10 in accordance with the present invention. The receiver portion is a synthesized receiver of the superheterodyne type wherein signals received by an antenna 12 are applied to a mixer 14 as shown. The mixer 14 is controlled by a synthesizer 16 utilizing a voltage control oscillator 18. The output of the mixer 14 is applied through IF amplifier stages 20 to a modulation detector 22, as shown, which detects the modulation on the received signal. The demodulated signal is applied through an audio amplifier 24 to a loudspeaker 26, as shown, for audio reproduction. In addition, the demodulation signal is applied to a conventional squelch circuit 28 and to a conventional channel activity detector 30 via a conductor 32. The squelch circuit 28 is coupled to the audio amplifier 24, to render the audio amplifier 24 operative upon receipt of a signal by the receiver to allow the reproduction of the signal by the loudspeaker 26. The squelch circuit is also coupled to the channel activity detector 30 as shown. The channel activity detector 30 is of a conventional type which detects the presence of an RF signal on the channel and produces a control signal in response which is coupled to a channel scan timing and control logic 32. The channel scan timing and control logic in the preferred embodiment is comprised of a microprocessor programmed to provide the control signals necessary to sequentially scan the radio frequency channels. The channel scan timing and control logic 32 is coupled to the synthesizer 16 as shown to control the synthesizer in the conventional manner so as to tune the radio to predetermined channels in sequential order. The channel scan timing and control logic 32 is also coupled, as shown, to a priority memory handler 34 which modifies the channel scanning sequence in response to a control signal coupled to the memory handler 34 via a conductor 35, as shown. Also coupled to the channel scan timing and control 32 and the priority memory handler 34 is a programmable read only memory(PROM) 36 within which are stored the predetermined priority channels. Also coupled to the conductor 35 is a switch 38 which generates the control signal to activate the priority memory handler 34. The switch 38, in the preferred embodiment, is the microphone hang up switch for the microphone 40. The microphone 40 is coupled, as shown, to a transmitter portion 42 of the radio 10 which transmits, in the conventional manner, a modulated signal via the antenna 12.

The channel scan timing and control 32 implemented utilizing a microcomputer provides a conventional channel scan with priority such as are widely used in the communications field. In such channel scanning systems, in which a single channel of priority is utilized a receiver is switched sequentially through each channel and locks on to a channel when a carrier is detected on that channel. In addition, if a nonpriority channel is being received the receiver periodically samples a priority channel during reception of signals on the non priority channel and locks on to the priority channel whenever a carrier is detected during the sampling interval. The sampling interval is maintained short enough to prevent interferring with the reception on the non-priority channel. In systems using multiple priority, a primary priority channel and a secondary priority channel are designated. The receiver sequentially scans each channel and when locked to a non priority channel alternately samples the primary priority and secondary priority channel and locks on to either priority channel whenever a carrier is detected during the sampling interval. In addition, during reception on the secondary priority channel the receiver periodically samples the primary priority channel and locks to the priority channel whenever carrier is detected. In the preferred embodiment of the invention a dual priority system is utilized.

When the preferred dual priority system is utilized the invention provides for the channel being monitored at the time the microphone is taken off the hook to be temporarily substituted into the place of the fixed secondary priority channel for a temporary time period. During this time period the fixed secondary priority channel is scanned as a non-priority channel, and is then automatically reassigned as the secondary priority channel at the end of the temporary period. In systems utilizing only a single priority channel, the monitored channel is treated as a secondary priority channel for the temporary time interval, after which the system is returned to single priority operation.

In addition, in scanning radio systems in which no channels are designated as priority channels, the invention provides for treating the monitored channel as single priority channel for a temporary period. In the preferred embodiment the temporary time period is a predetermined period of 60 seconds which begins when the microphone is placed on hook.

Figure 2:
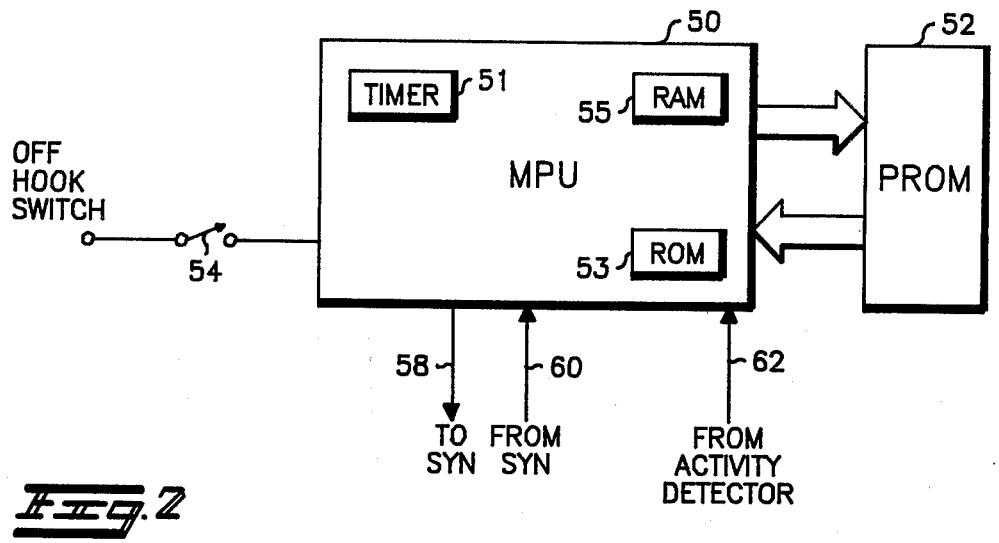
FIG. 2 is a detailed block diagram illustrating the microcomputer implementation of the scan control and priority memory handler for the scanning radio receiver according to the invention.

FIG. 2 illustrates the preferred microcomputer implementation of the channel scan timing and control logic and priority memory handler. A microcmputer 50, (in the preferred embodiment a Motorola MC3870 is utilized,) is coupled via an address bus to a PROM 52, as shown. The PROM 52 is preferably a tri-statable 256 by 4 bit programmable read only memory (e.g., Signetics 82S129). In addition, the PROM 52 is coupled via a data bus to a data port of the microcomputer 50. The predetermined priority channels are permanently stored in the PROM 52. The microcomputer 50 includes a timer 51, and a scan control logic program, and a priority memory handler program stored in internal ROM 53. In addition, the microcomputer includes internal random access memory 55 (RAM) which is utilized by the program to perform the channel scanning functions. An off hook switch 54 is coupled as shown, to an input port of the microcomputer 50 to provide a control signal to activate the priority memory handler portion of the scan control program. An additional input 60 is coupled from the synthesizer (see FIG. 1) to the input port of the microcomputer 50 and an output 58 is coupled from the microcomputer 50 to the synthesizer of FIG. 1. An input port 62 couples a signal from the activity detector 30 of FIG. 1 into the microcomputer 50. These inputs 60, 62, and output 58 are used to control the channel scanning function.

Figure 3:
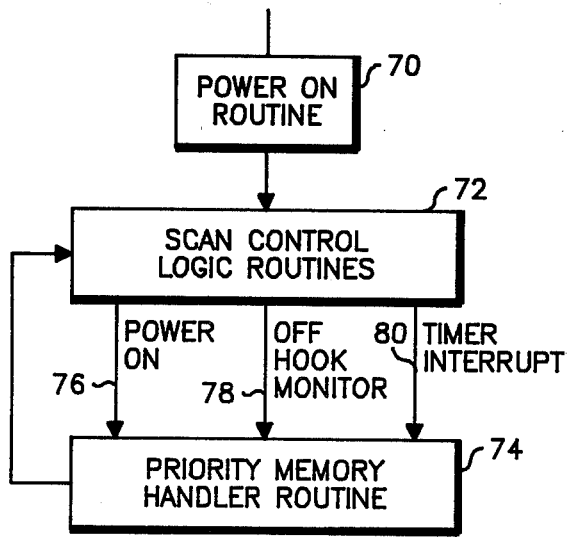
FIG. 3 is a general program flow diagram of the computer program for the invention.

Referring now to FIG. 3, there is shown a general program flow diagram of the computer program for the microcomputer 50 to implement the invention. Operation of the program sequence begins by intialization at block 70 by the POWER ON routine. Program flow then proceeds to block 72 which includes the SCAN CONTROL LOGIC routines which provide scanning of the channels by controlling the synthesizer via the output 58 shown in FIG. 2. Program flow will transfer to the PRIORITY MEMORY HANDLER routine 74 via several program paths. The power on path 76 will cause the PRIORITY MEMORY HANDLER routine to be entered upon power on of the system. The off hook monitor path 78 will cause the PRIORITY MEMORY HANDLER routine 74 to be entered when the microphone off hook switch is activated. Finally, the PRIORITY MEMORY HANDLER routine 74 will be entered via the timer interrupt path 80 when the internal microcomputer timer generates a timer interrupt.

FIG. 4 is a detailed program flow diagram of the PRIORITY MEMORY HANDLER routine for the invention based upon a dual priority scan. Upon power on of the system the routine is entered from the scan control via the block 100 and program flow proceeds to read the primary priority channel number from the PROM (shown in FIG. 2) as shown at block 102. The program than loads this channel number into the primary priority memory location ($P_1$) in RAM 55 as indicated at 104. The secondary priority channel is then read from the PROM and stored at the secondary channel location ($P_2$) in internal RAM 55, as indicated at 106 and 108. This results in initialization whereby the predetermined primary and secondary priority channels are established.

Upon activation of the off hook switch (see FIG. 1) the routine is entered at block 110 from the SCAN CONTROL LOGIC routine and program flow proceeds to block 112. At this point, the program determines the channel being monitored at the moment the off hook switch was activated and then proceeds to retrieve the channel number of the primary priority channel as indicated at 114. The priority one channel is then compared to the channel monitored ($P_s$) as indicated at 116 and if they are identical program flow proceeds to block 109 where program control is returned to the scan control logic. If however the monitored channel is not identical to the primary priority channel, the program flow proceeds to block 118 where the secondary priority channel is retrieved. The secondary priority channel is then compared to the monitored channel as indicated at 120. This sequence of steps determines whether the monitored channel is a priority channel. If the monitored channel and the secondary priority channel are identical, a temporary channel located in RAM 55 ($P_T$) is checked to determine if it is zero, as indicated at 122. If the temporary channel location is zero, program flow proceeds to block 109 where program control is returned to the scan control logic routine. If, however, the temporary channel location is not zero, program flow proceeds to block 124 where the timer 51 is stopped and then proceeds to block 130 to wait for the microphone to be returned to the on hook position. If at block 120 the monitored channel is not identical to the secondary priority channel the program then places the secondary priority channel in a temporary non-priority channel designation as indicated at 126 and assigns the monitored channel as the secondary priority channel temporarily as indicated at 128. Program flow then proceeds to block 130 to wait for the microphone to be put on hook and resets the off hook flag once the microphone is returned on hook as indicated at 132. The internal timer 51 is started as indicated at 134 and program flow then returns to the scan control logic as indicated at 109. The internal timer 51 is programmed to provide a desired period of time during which the monitored channel is treated as the secondary priority channel. In the preferred embodiment this time period is 60 seconds.

The PRIORITY MEMORY HANDLER routine is entered at 140 upon generation of the timer interrupt and program flow then proceeds to 142 where the temporary non-priority channel is retrieved from storage and the channel is restored in the secondary priority channel location as indicated at 144. The temporary non priority channel location is then set to zero as indicated at 146 and program flow then returns to the scan control logic as indicated at 109. Thus the original secondary priority channel is restored when the internal timer 51 has timed out.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. A scanning radio receiver for receiving signals on a predetermined number of channels, said receiver having scanning circuitry for sequentially selecting individual ones of said predetermined channels including priority channel monitoring circuitry, comprising:

switch means, for generating a control signal in response to activation of said switch means;

priority memory means, coupled to the scanning circuitry, for storing priority channel designations;

priority modification means, coupled to the switch means, for modifying the priority memory means in response to the control signal, including timing means, for generating a timing control signal a period of time after the priority memory means is modified, and further including restoration means, for at least partially restoring the priority memory means to its condition before modification in response to the timing means control signal, such that the channel selected by the scanning circuitry at the moment the control signal is generated is scanned as a priority channel, for a temporary time period.

2. A scanning radio receiver according to claim 1 having at least one designated priority channel wherein the priority modifying means replaces a designated priority channel in the priority memory means with the channel selected by the scanning circuitry at the moment the control signal is generated, and further comprising temporary channel storage means, operatively coupled to the scanning circuitry such that any channel stored therein is scanned without priority, for storing the designated priority channel displaced by the priority modifying means.

3. A scanning radio receiver according to claim 2 wherein the priority memory means includes a secondary priority memory means operatively coupled to the scanning circuitry such that any channel stored therein is scanned as a secondary priority channel, and wherein the priority modification means stores the channel selected at the moment the control signal is generated in the secondary priority memory means, thereby temporarily displacing any channel previously stored in the secondary priority memory means.

4. A scanning radio receiver according to claim 3 wherein a channel is designated as a fixed secondary priority channel and is stored in the secondary priority memory means, and wherein the temporary channel storage means stores the fixed secondary priority channel whenever the fixed secondary priority channel is displaced.

5. A scanning radio receiver according to claim 1, 2, 3 or 4 wherein the period of time ends after a predetermined time interval beginning when the control signal is removed by deactivation of the switch means.

6. A scanning radio receiver according to claim 2, wherein the switch means is adapted for generating a control signal to modify the priority memory means coupled to the scanning circuitry to permit the monitoring of a selected channel during operation of the scanning radio receiver.

7. A scanning radio receiver according to claim 4 wherein the switch means is adapted for generating a control signal to modify the priority memory means coupled to the scanning circuitry to permit the monitoring of a selected channel during operation of the scanning radio receiver.

* * * * *